United States Patent
Schulze et al.

(10) Patent No.: US 9,698,138 B2
(45) Date of Patent: Jul. 4, 2017

(54) POWER SEMICONDUCTOR DEVICE WITH IMPROVED STABILITY AND METHOD FOR PRODUCING THE SAME

(71) Applicant: Infineon Technologies AG, Neubiberg (DE)

(72) Inventors: Hans-Joachim Schulze, Taufkirchen (DE); Josef Lutz, Chemnitz (DE); Eric Pertermann, Chemnitz (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/967,578

(22) Filed: Dec. 14, 2015

(65) Prior Publication Data
US 2016/0172352 A1  Jun. 16, 2016

(30) Foreign Application Priority Data
Dec. 15, 2014  (DE) .................. 10 2014 118 664

(51) Int. Cl.
*H01L 29/88*  (2006.01)
*H01L 27/02*  (2006.01)
(Continued)

(52) U.S. Cl.
CPC .... *H01L 27/0255* (2013.01); *H01L 29/66151* (2013.01); *H01L 29/88* (2013.01)

(58) Field of Classification Search
CPC ......... H01L 29/00; H01L 29/66; H01L 29/86; H01L 29/88; H01L 29/661;
(Continued)

(56) References Cited

U.S. PATENT DOCUMENTS 9,190,511 B2 * 11/2015 Pfirsch ............... H01L 29/0634
2007/0170514 A1  7/2007 Mauder et al.
2014/0334212 A1  11/2014 Hashimoto et al.

FOREIGN PATENT DOCUMENTS

DE  102006046845 B4  12/2013
WO  2012046329 A1  4/2012

OTHER PUBLICATIONS

Kaindl, Winfried, "Modellierung höhenstrahlungsinduzierter Ausfälle in Halbleiterleistungsbauelementen", Dissertation, Technischen Universität Müunchen, 2005.
(Continued)

*Primary Examiner* — Monica D Harrison
(74) *Attorney, Agent, or Firm* — Murphy, Bilak & Homiller, PLLC

(57) ABSTRACT

A power semiconductor device includes a first contact, a second contact, and a semiconductor volume disposed between the first contact and the second contact. The semiconductor volume includes an n-doped field stop layer configured to spatially delimit an electric field that in the semiconductor volume during operation of the power semiconductor device, a heavily p-doped zone and a neighboring heavily n-doped zone, which together form a tunnel diode. The tunnel diode is located in the vicinity of, or adjacent to, or within the field stop layer. The tunnel diode is configured to provide protection against damage to the device due to a rise of an electron flow in an abnormal operating condition, by the fast provision of holes. Further, a method for producing such devices is provided.

18 Claims, 4 Drawing Sheets

(51) Int. Cl.
*H01L 21/26* (2006.01)
*H01L 29/66* (2006.01)

(58) Field of Classification Search
CPC ........... H01L 29/6615; H01L 29/66151; H01L 27/02; H01L 27/025; H01L 27/0255; H01L 21/26; H01L 21/265; H01L 21/32; H01L 21/324
USPC .................................................. 257/104–106
See application file for complete search history.

(56) References Cited

OTHER PUBLICATIONS

Jiang, Huaping et al., "Band-to-Band Tunneling Injection Insulated-Gate Bipolar Transistor with a Soft Reverse-Recovery Built-In Diode", IEEE Electron Device Letters, vol. 33, No. 12, Dec. 2012. pp. 1684-1686.

* cited by examiner

POWER SEMICONDUCTOR DEVICE WITH IMPROVED STABILITY AND METHOD FOR PRODUCING THE SAME

PRIORITY CLAIM

This application claims priority to German Patent Application No. 10 2014 118 664.8 filed on 15 Dec. 2014, the content of said application incorporated herein by reference in its entirety.

TECHNICAL FIELD

This disclosure relates to semiconductor devices with a PN junction. In particular, it relates to power semiconductor devices with improved stability.

BACKGROUND

In the field of power semiconductor technology, it is desirable to provide semiconductor devices with protection mechanisms that prevent destruction of the semiconductor devices under extreme switching conditions. Such extreme switching conditions arise because power semiconductor diodes are operated in commutation mode. When operated in commutation mode, high electric fields can occur, for example at the $n^-n$ junction of a $pn^-n$ semiconductor diode, which can lead to an avalanche-like generation of charge carriers at the $n^-n$ junction. At the same point in time, high electric field strengths can occur at the pn-junction of the $pn^-n$ semiconductor diode and lead to an avalanche-like generation of charge carriers at the $pn^-$ junction. The avalanche-like generation of charge carriers (so-called "avalanche generation") results in an inability to maintain the high electric field blocking capability of the semiconductor diode in the $n^-$-doped central region of the semiconductor diode. The semiconductor device thus loses its blocking capability and is destroyed unless external measures for limiting current and power have been implemented.

In order to avoid destruction of a semiconductor device such as a diode, the commutation process can be slowed down. When using such semiconductor diodes within insulated gate bipolar transistor (IGBT) semiconductor modules, however, such a slowdown can result in an increase in the switch-on losses of the IGBT. Other measures might lead to increased on-state or switching losses.

In US2007170514, a structure allowing an additional hole current is provided. To this end, additional p-doped regions are implemented in a field stop layer. By these p-doped regions directed towards a backside of the chip, an avalanche is created resulting in the desired hole injection. This provides for dynamically generated positive charges, or holes, to compensate for the incoming electrons.

Another variant is described in DE 102006046845 B4, where fixed positive charges are provided. During a normal shutdown operation, the reaction time of such p-regions is sufficient to cause an increase in softness and a reduction of the resulting switch-off during overload.

It has been shown that the previously described measures are generally not sufficient in cases of very rapid events such as, in particular, cosmic radiation events. The incoming radiation arrives in a narrow channel and thus causes an electron cloud, also called streamer. This phenomenon is associated with a field tip which rushes at high speed towards the cathode. According to simulations, such as described in W. Kaindl: "Modellierung höhenstrahlungsinduzierter Ausfälle in Halbleiterleistungsbauelementen", Dissertation, Technical University of Munich, 2005, the last 50 μm, for example, are crossed in only 1 picosecond. The problem is that since the occurrence of an avalanche takes some time, the response time of the above described implemented p-zones is not sufficient for such rapid events. Charge carriers are accelerated in an electric field and create new free carriers by impact ionization of charge carriers. The velocity of charge carriers at high fields in Si is about $10^7$ cm/s. The space charge zone for a structure in accordance with US2007170514 is, at a given blocking voltage of the pn-junction from about 10 to 100 V, in the case of the avalanche at only 10 V (as the lower limit provided for the design) at approximately a width w of 0.1 μm. The time required for a charge carrier to traverse this space charge zone is given by $t=w/v_s$, which calculates to 1 picosecond, whereby the acceleration phase is neglected. Such a time delay is also described for avalanche-use IMPATT diodes, whereby the time delay is half the period of an oscillation.

A further adverse effect is the positive temperature coefficient of the avalanche effect, leading to an additional delay in the injection of holes, as the process triggered by the cosmic radiation event causes also a temperature increase.

For the above and other reasons, there is a need for a power semiconductor device with improved properties.

SUMMARY

According to a first aspect, a power semiconductor device is provided. The power semiconductor device comprises a first contact, a second contact, and a semiconductor volume disposed between the first contact and the second contact. The semiconductor volume includes an n-doped field stop layer configured to spatially delimit an electric field formed in the semiconductor volume during operation of the power semiconductor device, a heavily p-doped zone and a neighboring heavily n-doped zone, which together form a tunnel diode. The tunnel diode is located in the vicinity of, or adjacent to, or within the field stop layer. The tunnel diode is configured to provide protection against damage to the device due to a rise of an electron flow in an abnormal operating condition, by the fast provision of holes.

According to a further aspect, a method for forming a power semiconductor device is provided. The method comprises: providing an n-doped semiconductor substrate; providing at least one pn-junction in the substrate; providing an n-doped field stop layer; providing a heavily p-doped zone adjacent to the field stop layer; and providing a heavily n-doped zone at least partially in contact to the heavily p-doped zone. The heavily p-doped zone and the heavily n-doped zone form a tunnel diode.

Those skilled in the art will recognize additional features and advantages upon reading the following detailed description, and upon viewing the accompanying drawings.

BRIEF DESCRIPTION OF THE DRAWINGS

The present invention is better understood by reading the following description of non-limiting embodiments with reference to the attached drawings which are briefly described as follows.

Figure 1:
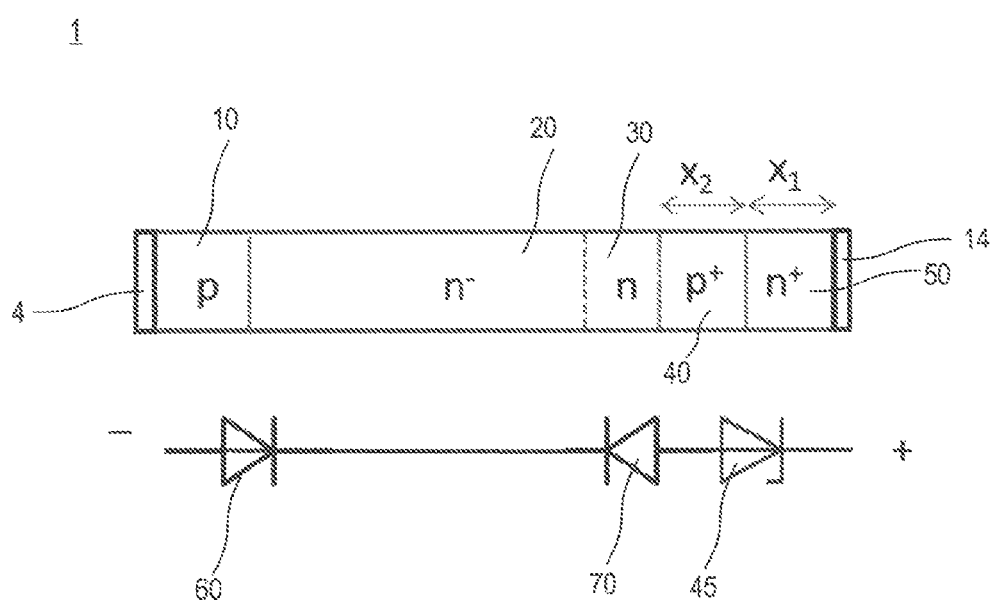
FIG. 1 shows a first embodiment of a power semiconductor device.

In the figures, identical or mutually corresponding components or groups of components are identified by the same reference numerals. It is to be noted, however, that the appended drawings illustrate only a few aspects of certain embodiments of this invention and are therefore not limiting of its scope, as the invention encompasses equally effective additional or equivalent embodiments.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front." "back," "leading," "trailing." etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the Figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be constructed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a main surface of a semiconductor substrate or body. This can be for instance the upper surface or front surface but also a lower or backside surface of a wafer or a die.

The term "vertical" as used in this specification intends to describe an orientation which is substantially arranged perpendicular to the main surface, i.e. parallel to the normal direction of the main surface of the semiconductor substrate or body.

The terms "above" and "below" as used in this specification intends to describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n−" means a doping concentration which is less than the doping concentration of an "n"-doping region while an "n+"-doping region has a larger doping concentration than the "n"-doping region. However, indicating the relative doping concentration does not mean that doping regions of the same relative doping concentration have to have the same absolute doping concentration unless otherwise stated. For example, two different n+-doping regions can have different absolute doping concentrations. The same applies, for example, to an n+-doping and a p+-doping region.

Specific embodiments described in this specification pertain to, without being limited thereto, to vertical semiconductor devices such as vertical n-channel or p-channel MOSFETs or IGBTs, in particular to vertical power MOSFETs and vertical power IGBTs, and to manufacturing methods therefor.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs (field-effect transistors) having a gate insulator that is not an oxide. i.e. the term MOSFET is used in the more general term meaning of IGFET (insulated-gate field-effect transistor) and MISFET (metal-insulator-semiconductor field-effect transistor), respectively.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region of the first conductivity type and a drift region of the first conductivity type. The drift region may be in contact with a drain region.

In the context of the present specification, the term "gate electrode" intends to describe an electrode which is situated next to, and configured to form and/or control a channel region. The term "gate electrode" shall embrace an electrode or conductive region which is situated next to, and insulated from the body region by an insulating region forming a gate dielectric region and configured to form and/or control a channel region through the body region by charging to an appropriate voltage.

Typically, the gate electrode is implemented as trench-gate electrode, i.e. as a gate electrode which is arranged in a trench extending from the main surface into the semiconductor substrate or body.

Typically, the semiconductor device is a power semiconductor device having an active area with a plurality of FET-cells (field-effect-transistor-cells such as MOSFET-cells, IGBT-cells and reverse conducting IGBT-cells, all of the former in the following generally also called "cells") for controlling a load current between two load metallization. Furthermore, the power semiconductor device may have a peripheral area with at least one edge-termination structure at least partially surrounding an active area of FET-cells when seen from above.

In the context of the present specification, the term "metallization" intends to describe a region or a layer with metallic or near metallic properties with respect to electric conductivity. A metallization may be in contact with a semiconductor region to form an electrode, a pad and/or a terminal of the semiconductor device. The metallization may be made of and/or comprise a metal such as Al, Ti, W, Cu, and Mo, or a metal alloy such as NiAl, but may also be made of a material with metallic or near metallic properties with respect to electric conductivity such as highly doped n-type or p-type poly-Si, TiN, an electrically conductive silicide such as TaSi2, TiSi2, PtSi, WSi2, MoSi, or an electrically conductive carbide such as AlC, NiC, MoC, TiC, PtC, WC or the like. The metallization may also include different electrically conductive materials, for example a stack of those materials.

In the context of the present specification, the terms "in ohmic contact", in resistive electric contact" and "in resistive electric connection" intend to describe that there is an ohmic current path between respective elements or portions of a semiconductor device at least when no voltages or only low testing voltages are applied to and/or across the semiconductor device. Likewise, the terms in low ohmic contact, "in low resistive electric contact" and "in low resistive electric connection" intend to describe that there is a low resistive ohmic current path between respective elements or portions of a semiconductor device at least when no voltages are applied to and/or across the semiconductor device. Within this specification the terms "in low ohmic contact", "in low resistive electric contact", "electrically coupled", and "in low resistive electric connection" are used synonymously.

In the context of the present specification, the term "depletable region" or "depletable zone" is intended to describe the fact that the corresponding semiconductor region or the corresponding semiconductor zone is substantially fully depleted (substantially free of free charge carriers) during the off state of the semiconductor component with an applied reverse voltage lying above a given threshold value. For this purpose, the doping charge of the depletable region is set accordingly and, in one or more embodiments, the depletable region is a weakly doped region. In the off state, the depletable region(s) form depleted region(s), also referred to as space charge region(s), typically a contiguous depleted zone whereby the current flow between two electrodes or metallizations connected to the semiconductor body can be prevented.

In the context of the present specification, the term "semiconductor mesa" intends to describe one of typically several semiconductor portions or zones which extend from a common semiconductor substrate or a common semiconductor layer to or at least define a main surface of the semiconductor body or wafer and are spaced apart from each other. Typically, a semiconductor mesa is, in a vertical cross-section which is substantially orthogonal to the main surface, arranged between two adjacent trenches extending from the main surface into the semiconductor body or wafer. The trenches may be substantially vertical (vertical trenches), i.e. the side walls of the trenches and the semiconductor mesa, respectively, may, in the vertical cross-section, be substantially orthogonal to the main surface. In the vertical cross-section, the two side walls of a trench and a semiconductor mesa, respectively, may also be tapered. The terms "semiconductor mesa", "mesa regions" and "mesa" are used synonymously within this specification. In the following the two side walls of a trench and a semiconductor mesa, respectively, are also referred to as first side wall and second side wall.

Typically, the semiconductor device includes a plurality of semiconductor mesa which are spaced apart from each other by trenches and includes at least to semiconductor regions of opposite conductivity type which form a pn-junction which each other. More typically, each of the semiconductor mesas includes two pn-junctions (a first and a second one) which are arranged below each other and extend, in a vertical cross-section, between or at least to the first side wall and the second side wall. The trenches may at least in the active area include a bottom wall which extends between the respective first and second walls. The trenches typically also include conductive gate electrodes which are insulated from the common substrate and the adjacent mesa regions by respective dielectric layers forming gate dielectric regions at the sidewalls. Accordingly, a FET-structure is formed which is in the following also referred to as MesaFET-structure. Likewise, a vertical semiconductor device with such a MESAFET-structure is also referred to as MesaFET, for example as MesaMOSFET and MesaIGBT, respectively.

A unit cell of the active area of a power MesaFET may, in a horizontal cross-section, include a trench-gate electrode and a respective portion of two adjoining mesas when viewed from above. In these embodiments, trench-gate electrodes, mesas and unit cells may form respective one-dimensional lattices.

Alternatively, a unit cell of an active area of a MesaFET may, in a horizontal cross-section, include a trench-gate electrode and a surrounding portion of a mesa when the trench-gate electrodes form a two-dimensional lattice, for example in the form of a checker board, when viewed from above.

The term "power semiconductor device" as used in this specification intends to describe a semiconductor device on a single chip with high voltage and/or high current switching capabilities. In other words, power semiconductor devices are intended for high current, typically in the Ampere range and/or high voltages, typically above about 30 V, more typically above about 100 V, even more typically above about 400 V.

The term "edge-termination structure" as used in this specification intends to describe a structure that provides a transition region in which the high electric fields around an active area of the semiconductor device change gradually to the potential at or close to the edge of the device and/or between a reference potential such as ground and a high voltage e. g. at the edge and/or backside of the semiconductor device. The edge-termination structure may, for example, lower the field intensity around a termination region of a rectifying junction by spreading the electric field lines across the termination region.

In the following, embodiments pertaining to semiconductor devices and manufacturing methods for forming semiconductor devices are explained mainly with reference to silicon (Si) semiconductor devices having a monocrystalline Si semiconductor body. Accordingly, a semiconductor region or layer is typically a monocrystalline Si-region or Si-layer if not stated otherwise.

It should, however, be understood that the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaP), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1-x) and silicon-SiGe heterojunction semiconductor materials. For power semiconductor applications currently mainly Si, SiC, GaAs and GaN materials are used. If the semiconductor body is made of a wide band-gap material, i.e. of a semiconductor material with a band-gap of at least about two electron volts such as SiC or GaN and having a high breakdown field strength and high critical avalanche field strength, respectively, the doping of the respective semiconductor regions can be chosen higher which reduces the on-state resistance Ron.

Generally, embodiments relate to a power semiconductor device comprising a semiconductor volume disposed between a first contact and a second contact. The device includes an n-doped field stop layer for spatially delimiting an electric field formed in the semiconductor volume during operation of the power semiconductor device. A heavily p-doped zone and a neighboring heavily n-doped zone together form a tunnel diode, which is located adjacent to the field stop layer. The tunnel diode provides protection against damage to the device due to a rise of an electron flow in an abnormal operating condition. This is ensured by a very fast provision of holes.

FIG. 1 shows a power semiconductor device 1 according to embodiments, which is a four layer structure embedded between the first electrode 4 and the second electrode 14. Below the schematic view of the power semiconductor device 1, an equivalent circuit diagram of the device is shown.

The power semiconductor device 1 is a diode with a pn-junction between a first p-doped layer 10 and the weakly n-doped base substrate 20. The latter is followed towards the second electrode 14 by an n-doped field stop layer 30. The heavily p-doped zone 40 and the adjacent heavily n-doped zone 50 together form a tunnel diode 45 (see equivalent circuit). It is, like the bipolar diode 60 itself, operated at blocking polarity when the diode 1 is operated in reverse direction. After a reversal of the polarity of the external voltage, the four-layer structure is switched rapidly similar to an overhead thyristor firing, thus the conduction loss is not increased. The overhead firing happens even at low voltages. The increase of the forward recovery voltage peak can be acceptable for certain applications. In other embodiments, semiconductor layers 10, 20, 30, 40, 50 can be doped with other suitable implant types.

For the dimensioning of the implemented p+/n+ tunnel diode 45, it is known from the literature that a tunnel breakdown sets in when the peak value of the electric field reaches $10^6$ V/cm. Further, at a breakdown voltage of $U_{BD}>6E_g/q$, avalanche breakdown is the dominant phenomenon, and for $4E_g/q<U_{BD}<6E/q$ there is a mixed breakthrough, while for $U_{BD}<4E_g/q$ there is pure tunnel breakthrough.

Thus, for silicon having a bandgap $E_g$ of 1.124V at 300K, the values 6.74 V and 4.5 V result from the formulas above. At higher temperatures, the bandgap $E_g$ becomes smaller, so that the tunnel breakthrough sets in earlier. Hence, to ensure that at least a fraction of the breakthrough is based on a tunnel phenomenon, in embodiments the breakthrough voltage $U_{BD}$ of the pn-junction of the tunnel diode 45 formed by the heavily p-doped zone 40 and the heavily n-doped zone 50 should typically be below 6.8 V as a general design rule according to embodiments. In order to achieve this, the dopant zones adjacent to the pn-junction of the tunnel diode 45 may typically have dopant concentrations of at least $C_{p+}=5\times10^{18}$ cm$^{-3}$ and $C_{n+}=1\times10^{20}$ cm$^{-3}$. It is expected that even a fraction of the tunnel current has a positive influence during a very fast event such as a cosmic radiation event. A particularly advantageous range for the dopant concentrations is expected for $C_{p+}$ greater than $5\times10^{19}$ cm$^{-3}$ and $C_{n+}$ greater than $3\times10^{20}$ cm$^{-3}$.

The depth x1 of the heavily n-doped zone 50 (see FIG. 1) can be chosen greater than 0.2 μm, while the width x2 of the heavily p-doped zone 40 is greater than 0.1 μm.

Figure 2:
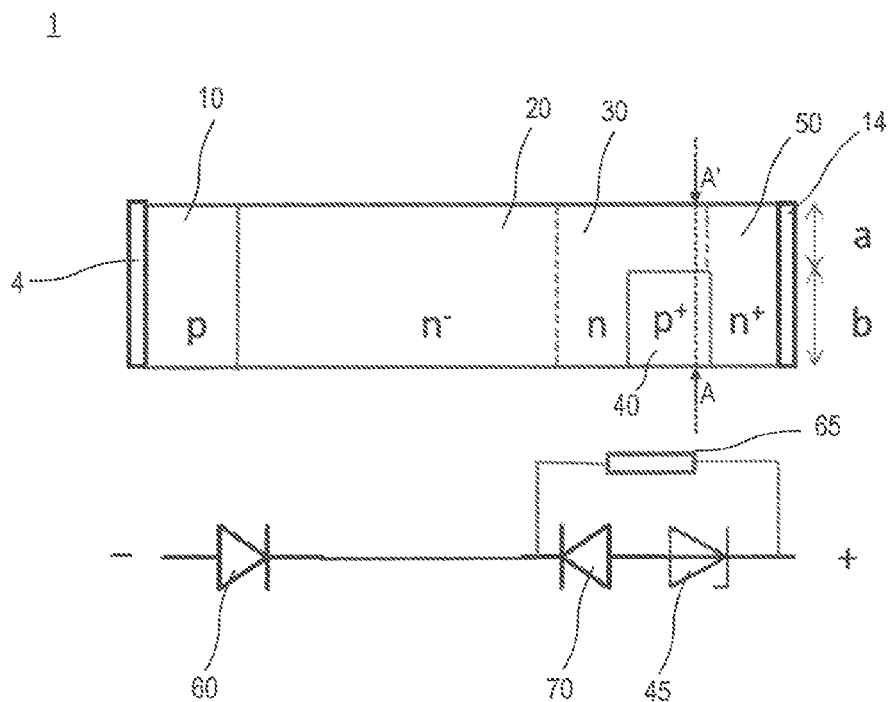
FIG. 2 shows a second embodiment of a power semiconductor device.

FIG. 2 shows a power semiconductor device 1 according to embodiments, wherein the forward recovery voltage peak (as was discussed with respect to FIG. 1) is constructively reduced. This is achieved by providing the heavily p-doped zone 40 only over a part of the lateral cross section of the power semiconductor device 1, namely to reduce the width to a fraction a/a+b of the cross sectional area. Thus, a part of the load current can flow directly from field stop layer 30 to heavily n-doped zone 50 without flowing through the pn-junction of tunnel diode 45. The cross sectional area in the plane of the tunnel diode 45 (represented by a), which is not part of the tunnel diode, typically has a diameter of 15 μm or smaller, more typically 10 μm or smaller. Effectively, by these measures there is provided a shunt resistor 65 in parallel to the tunnel diode 45.

For the design of the structure, it may be taken into account that the geometrical area of the zone with dimension b, the heavily p-doped zone, should prevail over the size of a for the following reasons. The width of a is limited by the fact that an incoming streamer should not have the option to bypass the heavily p-doped area. Defects caused by streamers often show a diameter of the produced pin-hole of smaller than 20 μm, more typically smaller than 15 μm. Thus, the (average) cross sectional dimension of a should not be bigger than 15 μm, more typically smaller than 10 μm, in order to avoid that an electron cloud can bypass the tunnel diode 45, which would adversely affect the intended protection against damage.

Figure 3:
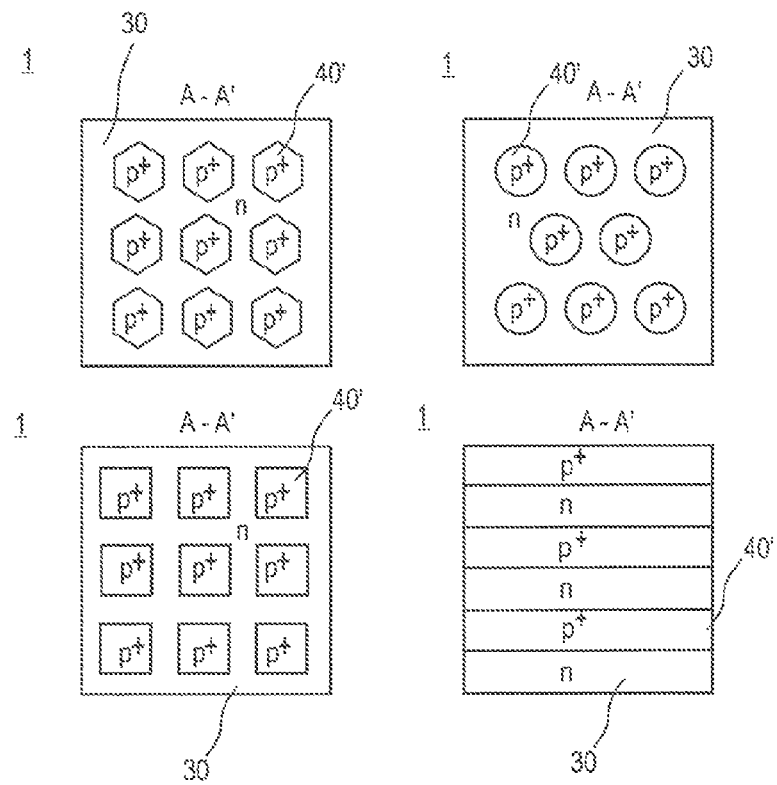
FIG. 3 shows cross sectional views of four variants of the power semiconductor device of FIG. 2.

In embodiments, the p-doped area 40 can have relatively large dimensions (related to the cross sectional area) so that the ratio between the heavily p-doped zone 40 and the n-doped zone, which is field stop layer 30, adjacent to the heavily p-doped zone 40 in the same depth (for example, at A-A') can be larger than 20%, or even larger than 40%, or even larger than 80%. The heavily p-doped zone 40 may be provided as several heavily p-doped islands 40', which may have the shape of circles, rectangular stripes, complementary forms, or various kinds of polygons, such as triangles, squares, pentagons, hexagons, etc. This is shown in FIG. 3, where four different cross-sectional views along line A-A' in FIG. 2 are shown according to varying embodiments of power semiconductor device 1, with heavily p-doped islands 40', together forming heavily p-doped zone 40, which are embedded in the n-doped field stop layer 30. It is understood that these four examples are non-limiting, and that the skilled person may derive other variations, or combinations of the shown embodiments, to yield further embodiments.

Figure 4:
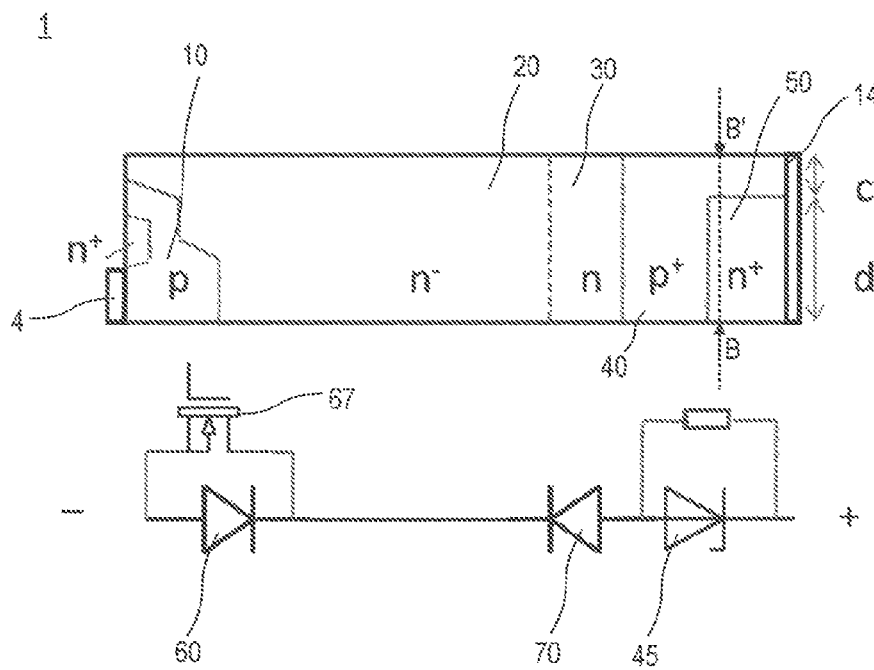
FIG. 4 shows a further embodiment of a power semiconductor device.
Figure 5:
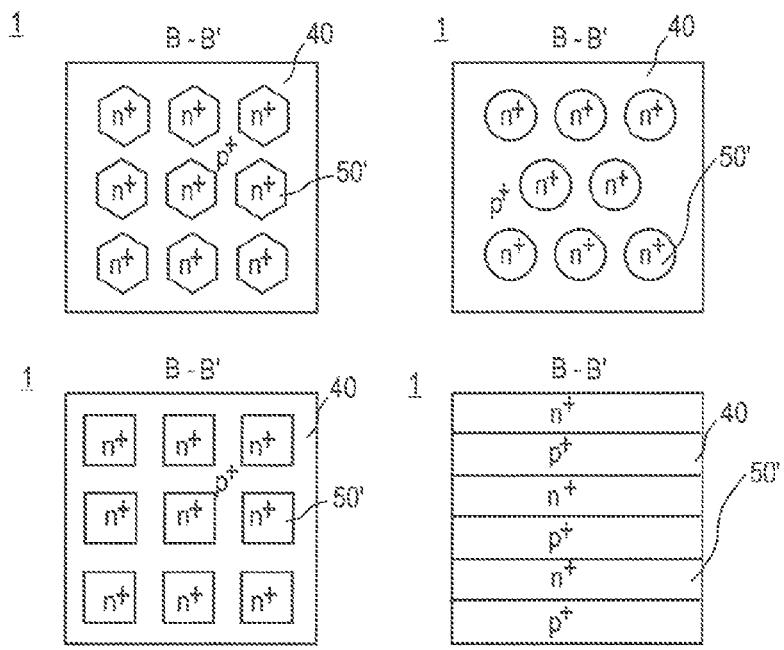
FIG. 5 shows cross sectional views of four variants of the power semiconductor device of FIG. 4.

FIG. 4 shows an embodiment where the power semiconductor device 1 is an IGBT with an integrated tunnel diode 45 on the side of the collector (second contact 14). The emitter side is simplified for illustrational purposes, having a diode 60 and a MOS-gate electrode 67. The device may in embodiments also be a trench IGBT, or other field effect controlled transistors known in the art. The heavily n-doped zone 50 can have dimensions so that the ratio between the heavily p-doped zone 40 adjacent to the heavily n-doped area 50 in the same depth (at B-B', for example) and the heavily n-doped area 50 can be larger than 10% or even larger than 30% or even larger than 50%. The heavily n-doped zone 50 may be provided as several heavily n-doped islands 50', which may have the shape of circles, rectangular stripes, complementary forms, or various kinds of polygons, such as triangles, squares, pentagons, hexagons, etc. can be circles, rectangular stripes, complementary forms or various kinds of polygons, such as triangles, squares, pentagons, hexagons, etc. In FIG. 5, four different cross-sectional views along line B-B' in FIG. 4 are shown according to varying embodiments of power semiconductor device 1, with heavily n-doped islands 50', together forming heavily n-doped zone 50, are embedded in the heavily p-doped layer 40. It is understood that these four examples are non-limiting, and that the skilled person may derive other variations, or combinations of the shown embodiments, to yield further embodiments.

Figure 6:
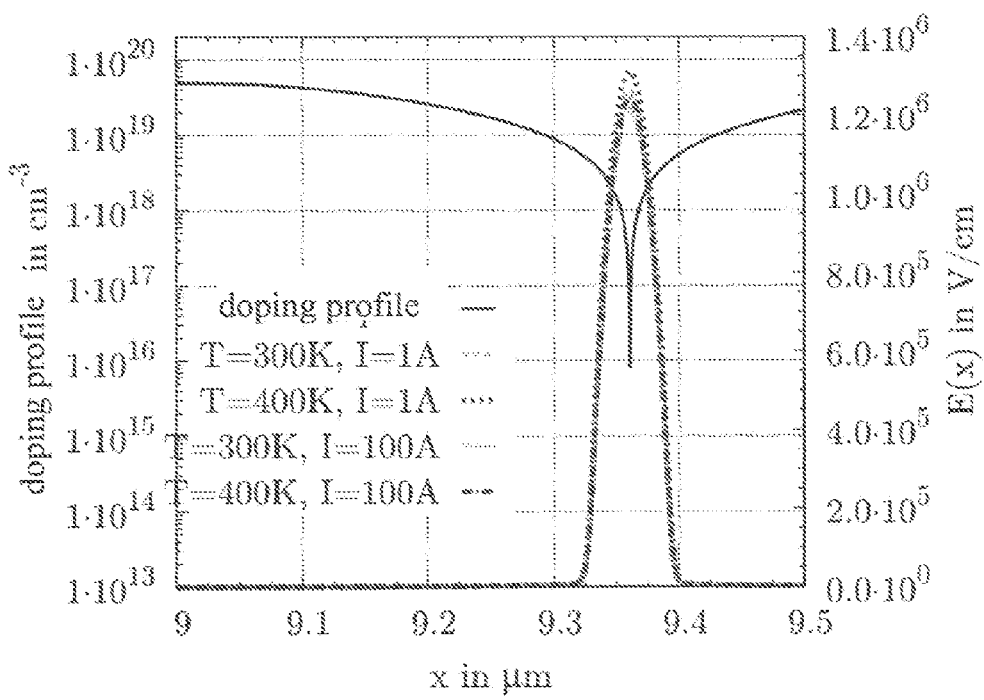
FIG. 6 shows a diagram indicating dopant concentrations and field strengths in exemplary structure according to embodiments.

FIG. 6 shows a simulated design example of a p+/n+ tunnel junction of the tunnel diode 45. The n+ doping was chosen to be $C_{n+}=1.5 \times 10^{20}$ cm$^{-3}$, the doping of the p+ side to be $C_{p+}=5 \times 10^{19}$ cm$^{-3}$. The top field strength is $1.27 \times 10^{6}$ V/cm at 300K, well above the limit of $10^6$ V/cm. Hence, it is to be expected that the tunnel current will be a dominant component. The breakdown voltage of this pn-junction is about 5.7 V at room temperature. A part of the p+ area is on the left side, and a part of the n+ area is on the right side in the graph. The width of the space charge zone is about 0.075 µm.

Figure 7:
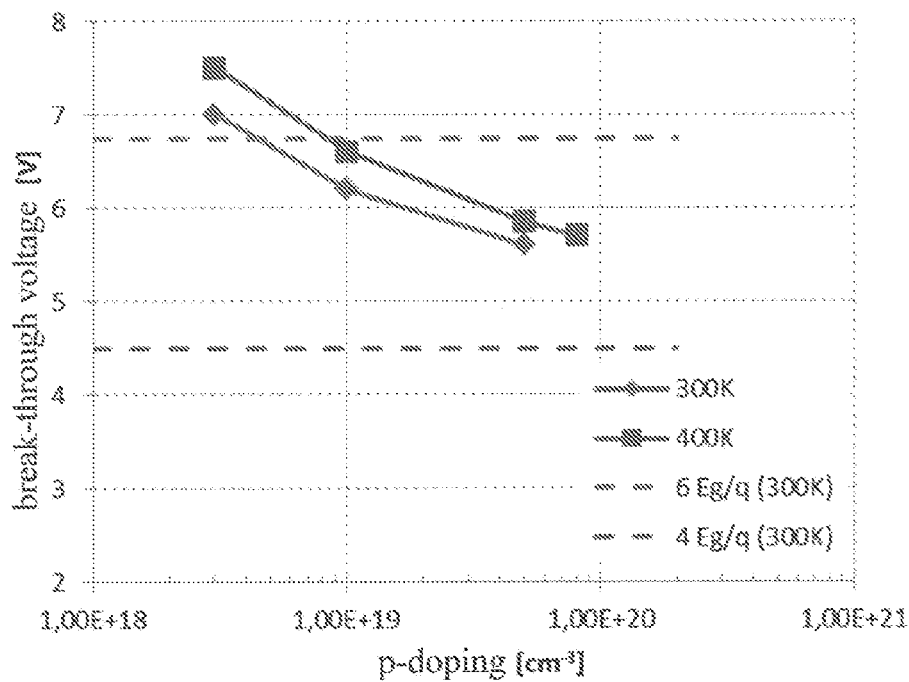
FIG. 7 shows a diagram indicating breakthrough voltages in structures in relation to dopant concentrations.

In FIG. 7, the blocking capability of a pn-junction at the transition to a tunnel effect is depicted. At a breakdown voltage greater than 6 Eg/q, pure avalanche breakdown is observed, between 4 and 6 times $E_g/q$ there is a coexistence between avalanche and tunneling (mixed breakdown), while at a breakdown voltage smaller than 4 $E_g/q$, pure tunnel breakthrough is to be expected.

The power semiconductor devices according to embodiments described herein may be realized in a number of ways. One method relates to epitaxial deposition of layers 30, 40 and 50 on a substrate 20, combined with ion implantation employing masks. One method starts with a highly doped substrate 50 and subsequent epitaxial deposition of layers 40, 30 and 20.

Alternatively, the heavily doped n- and p-zones may be produced by ion implantation in combination with annealing steps. Also, laser-induced melting processes can be carried out from a backside of the wafer. Thereby, the heavily doped n-zones may in the case of diodes be an integral part of the n-doped back side emitter. In the case of IGBTs, the heavily doped n-zones may be part of the stop zone.

It is also possible to produce a p-doped collector zone of an IGBT by employing structures such as shown with respect to FIG. 1 and FIG. 2.

With the above range of variations and applications in mind, it should be understood that the present invention is not limited by the foregoing description, nor is it limited by the accompanying drawings. Instead, the present invention is limited only by the following claims and their legal equivalents.

The written description above uses specific embodiments to disclose the invention, including the best mode, and also to enable any person skilled in the art to make and use the invention. While the invention has been described in terms of various specific embodiments, those skilled in the art will recognize that the invention can be practiced with modification within the spirit and scope of the claims. Especially, mutually non-exclusive features of the embodiments described above can be combined with each other. The patentable scope is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

It is to be understood that the features of the various example embodiments described herein can be combined with each other, unless specifically noted otherwise.

Although specific embodiments have been illustrated and described herein, it will be appreciated by those of ordinary skill in the art that a variety of alternate and/or equivalent implementations can be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor device, comprising:
   a first contact;
   a second contact;
   a semiconductor volume disposed between the first contact and the second contact, including:
      an n-doped field stop layer configured to spatially delimit an electric field formed in the semiconductor volume during operation of the power semiconductor device;
      a heavily p-doped zone and a neighboring heavily n-doped zone, which together Form a tunnel diode, the tunnel diode being located in the vicinity of, or adjacent to, or within the field stop layer,
      wherein the tunnel diode is configured to provide protection against damage to the device due to a rise of an electron flow in an abnormal operating condition, by the last provision of holes,
      wherein a thickness of the heavily n-doped zone in a direction of a load current is at least 0.2 µm, and a thickness of the heavily p-doped zone in a direction of a load current is at least 0.1 µm.

2. The power semiconductor device of claim 1, wherein a dopant concentration of the heavily p-doped zone is at least about $5 \times 10^{18}$ cm$^{-3}$, and a dopant concentration of the heavily n-doped zone is at least about $1 \times 10^{20}$ cm$^{-3}$.

3. The power semiconductor device of claim 1, wherein one of the heavily n-doped zone and the heavily p-doped zone take up a fraction of the lateral cross sectional area of the power semiconductor device only, such that during operation a part of a load current flows in parallel to the tunnel diode through the remainder oldie cross sectional area.

4. The power semiconductor device of claim 3, wherein the cross sectional area in the plane of the tunnel diode, which is not part of the tunnel diode, has a diameter of 15 µm or smaller.

5. The power semiconductor device of claim 1, wherein at least one of the heavily p-doped zone and the heavily n-doped zone comprises a plurality of heavily doped islands.

6. The power semiconductor device of claim 1, further comprising heavily p-doped islands, which together form the heavily p-doped zone and are embedded in the n-doped field stop layer.

7. The power semiconductor device of claim 1, further comprising heavily n-doped islands, which together form the heavily n-doped zone and are embedded in the heavily p-doped zone.

8. The power semiconductor device of claim 1, wherein the power semiconductor device is a diode, an IGBT, or as MOSFET.

9. A method for forming a power semiconductor device, the method comprising:
providing an n-doped semiconductor substrate;
providing at least one pn-junction in the substrate;
providing an n-doped held stop layer;
providing a heavily p-doped zone adjacent to the field stop layer; and
providing a heavily n-doped zone at least partially in contact with the heavily p-doped zone,
wherein the heavily p-doped zone and the heavily n-doped zone form a tunnel diode located in the vicinity of, or adjacent to, or within the field stop layer,
wherein a thickness of the heavily n-doped zone in a direction of a load current flow is at least 0.2 µm, and a thickness of the heavily p-doped zone in a direction of a load current flow is at least 0.1 µm.

10. The method of claim 9, wherein a dopant concentration of the heavily p-doped zone is at least about $5 \times 10^{18}$ cm$^{-3}$, and a dopant concentration of the heavily n-doped zone is at least about $1 \times 10^{20}$ cm$^{-3}$.

11. The method of claim 9, wherein the power semiconductor device is a diode, an IGBT, or as MOSFET.

12. The method or claim 9, wherein at least one or the heavily p-doped zone and the heavily n-doped zone are provided in a form of a plurality of heavily doped islands.

13. The method or claim 9, wherein either:
providing heavily p-doped islands, which together form the heavily p-doped zone and are embedded in the n-doped field stop layer;
providing heavily n-doped islands, which together form the heavily n-doped zone and are embedded in the heavily p-doped zone.

14. The method of claim 9, wherein the n-doped field stop layer, the heavily p-doped zone, and the heavily n-doped zone are epitaxially deposited on a substrate, followed by ion implantation employing a mask.

15. The method or claim 9, wherein dopings of the heavily p-doped zone and/or the heavily n-doped zone are provided by ion implantation in combination with subsequent annealing.

16. A power semiconductor device, comprising:
a first contact;
a second contact;
a semiconductor volume disposed between the first contact and the second contact, including:
an n-doped field stop layer configured to spatially delimit an electric field formed in the semiconductor volume during operation of the power semiconductor device;
a heavily p-doped zone and a neighboring heavily n-doped zone, which together form a tunnel diode, the tunnel diode being located in the vicinity of, or adjacent to, or within the field stop layer,
wherein the tunnel diode is configured to provide protection against damage to the device clue to a rise of an electron flow in an abnormal operating condition, by the fast provision of holes,
wherein a dopant concentration of the heavily p-doped zone is at least about $5 \times 10^{18}$ cm$^{-3}$, and a dopant concentration of the heavily n-doped zone is at least about $1 \times 10^{20}$ cm$^{-3}$.

17. A power semiconductor device, comprising:
a first contact;
a second contact;
a semiconductor volume disposed between the first contact and the second contact, including:
an n-doped field stop layer configured to spatially delimit an electric field formed in the semiconductor volume during operation of the power semiconductor device;
a heavily p-doped cone and a neighboring heavily n-doped zone, which together Corm a tunnel diode, the tunnel diode being located in the vicinity of, or adjacent to, or within the field stop layer,
wherein the tunnel diode is configured to provide protection against damage to the device due to a rise of an electron flow in an abnormal operating condition, by the fast provision holes,
wherein the n-doped field stop layer is directly adjacent a first side of the heavily p-doped zone and the heavily n-doped zone is directly adjacent a second side of the heavily p-doped zone opposite the first side.

18. The power semiconductor device of claim 17, wherein the first side of the heavily p-doped zone faces the first contact, wherein the second side of the heavily p-doped zone faces the second contact, and wherein the heavily p-doped zone is separated from the second contact by the heavily n-doped zone.

* * * * *

UNITED STATES PATENT AND TRADEMARK OFFICE
CERTIFICATE OF CORRECTION

PATENT NO. : 9,698,138 B2
APPLICATION NO. : 14/967578
DATED : July 4, 2017
INVENTOR(S) : Hans-Joachim Schulze et al.

Page 1 of 1

It is certified that error appears in the above-identified patent and that said Letters Patent is hereby corrected as shown below:

In the Claims

Column 10, Line 49 (Claim 1, Line 11), please change "Form" to -- form --.
Column 11, Line 26 (Claim 9, Line 5), please change "held" to -- field --.
Column 12, Line 20 (Claim 16, Line 15), please change "clue" to -- due --.
Column 12, Line 36 (Claim 17, Line 10), please change "cone" to -- zone --.
Column 12, Line 37 (Claim 17, Line 11), please change "Corm" to -- form --.

Signed and Sealed this
Twenty-sixth Day of September, 2017

Joseph Matal
*Performing the Functions and Duties of the*
*Under Secretary of Commerce for Intellectual Property and*
*Director of the United States Patent and Trademark Office*